United States Patent
Takeda et al.

(10) Patent No.: US 6,746,817 B2
(45) Date of Patent: Jun. 8, 2004

(54) RESIST COMPOSITION AND PATTERNING PROCESS

(75) Inventors: Takanobu Takeda, Nakakubiki-gun (JP); Jun Hatakeyama, Nakakubiki-gun (JP); Osamu Watanabe, Nakakubiki-gun (JP); Hiroshi Kubota, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 128 days.

(21) Appl. No.: 09/984,726

(22) Filed: Oct. 31, 2001

(65) Prior Publication Data

US 2002/0081521 A1 Jun. 27, 2002

(30) Foreign Application Priority Data

Nov. 1, 2000 (JP) .......................................... 2000-334340

(51) Int. Cl.⁷ ........................... G03C 1/73; G03F 7/039; G03F 7/20; G03F 7/30
(52) U.S. Cl. .................... 430/270.1; 430/326; 430/327; 430/328; 430/330; 430/905; 430/907; 430/910; 430/914
(58) Field of Search ................................ 430/270.1, 905, 430/910, 914, 325, 326, 327, 328, 330, 907

(56) References Cited

U.S. PATENT DOCUMENTS

| | | |
|---|---|---|
| 4,409,318 A | 10/1983 | Chandross et al. |
| 4,491,628 A | 1/1985 | Ito et al. |
| 5,310,619 A | 5/1994 | Crivello et al. |

FOREIGN PATENT DOCUMENTS

| | | | |
|---|---|---|---|
| EP | 0 499271 A1 | * | 8/1992 |
| EP | 0789279 A1 | | 8/1997 |
| EP | 1020768 A1 | | 7/2000 |
| JP | 62-115440 | | 5/1987 |
| JP | 63-27829 | | 2/1988 |
| JP | 2-27660 | | 6/1990 |
| JP | 04249509 | | 12/1990 |
| JP | 3-223858 | | 10/1991 |
| JP | 3-275149 | | 12/1991 |
| JP | 4-211258 | | 8/1992 |
| JP | 6-100488 | | 4/1994 |
| JP | 6-289608 | | 10/1994 |

OTHER PUBLICATIONS

Japanese Abstract of JP 04249509.
International Search Report for EP 01309168.

* cited by examiner

*Primary Examiner*—Mark F. Huff
*Assistant Examiner*—Sin J. Lee
(74) *Attorney, Agent, or Firm*—Millen, White, Zelano & Branigan, P.C.

(57) ABSTRACT

A polymer comprises recurring units of formula (1) and recurring units having acid labile groups which units increase alkali solubility as a result of the acid labile groups being decomposed under the action of acid, and has a Mw of 1,000–500,000.

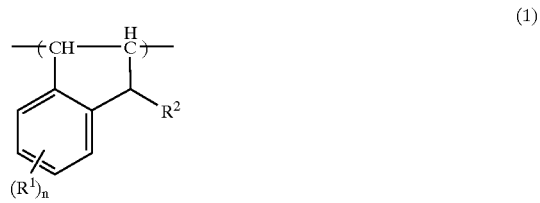

(1)

$R^1$ and $R^2$ each are hydrogen, hydroxyl, hydroxyalkyl, alkyl, alkoxy or halogen, and n is 0, 1, 2, 3 or 4. The polymer is useful as a base resin to form a chemically amplified, positive resist composition which has advantages including a significantly enhanced contrast of alkali dissolution rate before and after exposure, high sensitivity, high resolution, and high etching resistance and is best suited as a micropatterning material for use in VLSI manufacture.

18 Claims, 1 Drawing Sheet

Dry etching resistance

FIG. 1

RESIST COMPOSITION AND PATTERNING PROCESS

This invention relates to a resist composition, typically chemically amplified positive resist composition, which has a remarkably increased contrast of alkali dissolution rate before and after exposure, a high sensitivity, high resolution, and etching resistance and lends itself to the microfabrication of VLSI's.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a minimum feature size of 0.5 μm or less and, when a resist having low light absorption is used, can form patterns with sidewalls that are nearly perpendicular to the substrate.

Recently developed acid-catalyzed chemical amplification positive resists, such as those described in JP-B 2-27660, JP-A 63-27829, U.S. Pat. Nos. 4,491,628 and 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base resin and a photoacid generator, and three-component systems comprising a base resin, a photoacid generator, and a dissolution inhibitor having acid labile groups.

For example, JP-A 62-115440 describes a resist material comprising poly-4-tert-butoxystyrene and a photoacid generator, and JP-A 3-223858 describes a similar two-component resist material comprising a resin bearing tert-butoxy groups within the molecule, in combination with a photoacid generator. JP-A 4-211258 describes a two-component resist material which is comprised of polyhydroxystyrene bearing methyl, isopropyl, tert-butyl, tetrahydropyranyl, and trimethylsilyl groups, together with a photoacid generator.

JP-A 6-100488 discloses a resist material comprised of a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator.

The base resins in these resist materials bear acid labile groups on side chains. When these acid labile groups are groups such as tert-butyl and tert-butoxycarbonyl which are cleaved by strong acids, the resist pattern tends to take on a T-top profile. By contrast, when the acid labile groups are alkoxyalkyl groups such as ethoxyethyl which are cleaved by weak acids, the corresponding resins have the drawback that the pattern configuration is considerably narrowed as the time interval between exposure and heat treatment increases. Moreover, the presence of bulky groups on the side chains lowers the heat resistance of the resin and leads to an unsatisfactory sensitivity and resolution. These problems have hitherto prevented the practical implementation of either approach.

To provide higher transparency and firm adhesion to substrates and to improve footing on substrates and etching resistance, JP-A 3-275149 and 6-289608 propose resist materials using a copolymer of hydroxystyrene and tertiary alkyl (meth)acrylate. The resist materials of this type suffer from poor heat resistance and an indefinite pattern profile after exposure and are not satisfactory in etching resistance as well. Since the current progress toward higher resolution entails the simultaneous progress toward thinner film patterns, it would be desirable to have a resist material with higher etching resistance.

SUMMARY OF THE INVENTION

An object of the invention is to provide a resist composition, especially chemically amplified positive resist composition, which is superior to prior art resist compositions in sensitivity, resolution, exposure latitude and process flexibility, and has a satisfactory pattern profile after exposure and high etching resistance. Another object is to provide a patterning process using the resist composition.

It has been found that a polymer having recurring units of the following general formula (1) or (2) and having a weight average molecular weight of 1,000 to 500,000 is an effective base resin in a positive resist composition, especially chemically amplified positive resist composition. The chemically amplified positive resist composition containing a photoacid generator and an organic solvent as well as the polymer has many advantages including an increased dissolution contrast of a resist film, high resolution, improved latitude of exposure, improved process flexibility, a good pattern profile after exposure, and high etching resistance. The composition is thus suited for practical use and advantageously used in microfabrication, especially in VLSI manufacture.

In one aspect, the invention provides a resist composition comprising a polymer comprising recurring units of the following general formula (1) and recurring units having acid labile groups which units increase alkali solubility as a result of the acid labile groups being decomposed under the action of acid, and having a weight average molecular weight of 1,000 to 500,000.

(1)

Herein $R^1$ and $R^2$ each are a hydrogen atom, hydroxyl group, substitutable hydroxyalkyl group, straight or branched alkyl group, substitutable alkoxy group, or halogen atom, and n is 0 or a positive integer of 1 to 4.

In another aspect, the invention provides a resist composition comprising a polymer comprising recurring units of the following general formula (2) and having a weight average molecular weight of 1,000 to 500,000.

(2)

-continued

Herein $R^1$, $R^2$ and $R^4$ each are a hydrogen atom, hydroxyl group, substitutable hydroxyalkyl group, straight or branched alkyl group, substitutable alkoxy group, or halogen atom, $R^3$ and $R^5$ each are hydrogen or methyl, $R^6$ is a hydrogen atom, methyl group, alkoxycarbonyl group, cyano or halogen atom, $R^7$ is an alkyl group of 1 to 20 carbon atoms, n is 0 or a positive integer of 1 to 4, m is 0 or a positive integer of 1 to 5, p, q and s each are 0 or a positive number, and r is a positive number.

In formula (2), one or both of $R^1$ and $R^4$ are preferably selected from among groups of the following formulae (3) and (4), straight, branched or cyclic tertiary alkoxy groups of 4 to 20 carbon atoms, trialkylsiloxy groups whose alkyl portions each have 1 to 6 carbon atoms, and oxoalkoxy groups of 4 to 20 carbon atoms.

(3)

(4)

Herein $R^8$, $R^9$, $R^{11}$ and $R^{12}$ are independently selected from hydrogen and straight or branched alkyl groups of 1 to 8 carbon atoms, $R^{10}$ is a monovalent hydrocarbon group of 1 to 18 carbon atoms which may be separated by an oxygen atom, or a pair of $R^8$ and $R^9$, $R^8$ and $R^{10}$, or $R^9$ and $R^{10}$ may form a ring and each of $R^8$, $R^9$ and $R^{10}$ is a straight or branched alkylene group of 1 to 18 carbon atoms when they form a ring, $R^{13}$ is a straight, branched or cyclic alkyl group of 4 to 40 carbon atoms, and "a" is 0 or a positive integer of 1 to 5.

In a second aspect, the invention provides a chemically amplified positive resist composition comprising (A) an organic solvent, (B) the above-defined polymer as a base resin, and (C) a photoacid generator. The resist composition may further include (D) a dissolution inhibitor. Preferably the resist composition further includes (E) a basic compound.

In a third aspect, the invention provides a process for forming a resist pattern comprising the steps of applying the resist composition onto a substrate to form a coating; heat treating the coating and then exposing it to high-energy radiation or electron beams through a photo mask; and optionally heat treating the exposed coating and developing it with a developer.

DESCRIPTION OF THE PREFERRED EMBODIMENT

Polymer

The resist composition of the invention contains as a base resin a polymer or high molecular weight compound comprising recurring units of the following general formula (1) and recurring units having acid labile groups which units increase alkali solubility as a result of the acid labile groups being decomposed under the action of acid, and having a weight average molecular weight of 1,000 to 500,000. The polymer is insoluble or substantially insoluble in an aqueous alkaline solution or alkaline developer. Typical of the polymer is one having recurring units of the following general formula (2).

(1)

(2)

Herein each of $R^1$, $R^2$ and $R^4$ is a hydrogen atom, hydroxyl group, substitutable hydroxyalkyl group, straight or branched alkyl group, substitutable alkoxy group, or halogen atom. Each of $R^3$ and $R^5$ is hydrogen or methyl. $R^6$ is a hydrogen atom, methyl group, alkoxycarbonyl group, cyano or halogen atom. $R^7$ is an alkyl group of 1 to 20 carbon atoms. The subscript n is 0 or a positive integer of 1 to 4, m is 0 or a positive integer of 1 to 5, p, q and s each are 0 or a positive number, and r is a positive number.

Suitable substitutable hydroxyalkyl groups represented by $R^1$, $R^2$ and $R^4$ include hydroxymethyl, trifluoromethylated hydroxymethyl, and ditrifluoromethylated hydroxymethyl. Suitable straight or branched alkyl groups represented by $R^1$, $R^2$ and $R^4$ include those of 1 to 20 carbon atoms, especially 1 to 10 carbon atoms, such as methyl, ethyl, propyl, isopropyl, n-butyl, iso-butyl and tert-butyl. Suitable substitutable alkoxy groups represented by $R^1$, $R^2$ and $R^4$ include those of 1 to 20 carbon atoms, especially 1 to 10 carbon atoms, such as methoxy, ethoxy and isopropoxy.

When the groups represented by $R^1$ and $R^4$ exhibit the function of acid labile group, they are selected from a variety of such groups, especially groups of the following general formulae (3) and (4), straight, branched or cyclic tertiary alkoxy group of 4 to 20 carbon atoms, trialkylsiloxy groups whose alkyl groups each have 1 to 6 carbon atoms, and oxoalkoxy groups of 4 to 20 carbon atoms.

(3)

(4)

Herein, $R^8$, $R^9$, $R^{11}$ and $R^{12}$ are independently selected from hydrogen and straight or branched alkyl groups of 1 to 8 carbon atoms. $R^{10}$ is a monovalent hydrocarbon group of 1 to 18 carbon atoms, such as alkyl, alkenyl, aryl or aralkyl, which may be separated by an oxygen atom. A pair of $R^8$ and $R^9$, a pair of $R^8$ and $R^{10}$, or a pair of $R^9$ and $R^{10}$ may form a ring, and each of $R^8$, $R^9$ and $R^{10}$ is a straight or branched alkylene group of 1 to 18 carbon atoms when they form a ring. $R^{13}$ is a straight, branched or cyclic alkyl group of 4 to 40 carbon atoms. The subscript "a" is 0 or a positive integer of 1 to 5.

Illustrative examples of the acid labile group of formula (3) include those having an intervening oxygen atom, such as methoxyethyloxy, ethoxyethyloxy, n-propoxyethyloxy, iso-propoxyethyloxy, n-butoxyethyloxy, iso-butoxyethyloxy, tert-butoxyethyloxy, cyclohexyloxyethyloxy, methoxy-propyloxy, ethoxypropyloxy, 1-methoxy-1-methyl-ethyloxy, 1-ethoxy-1-methyl-ethyloxy, tetrahydropyranyloxy, and tetrahydrofuranyloxy. Illustrative examples of the acid labile group of formula (4) include tert-butoxycarbonyloxy, tert-butoxycarbonylmethyloxy, ethylcyclopentylcarbonyloxy, ethyl-cyclohexylcarbonyloxy, and methylcyclopentylcarbonyloxy. Exemplary of the trialkylsiloxy group are those in which alkyl groups each have 1 to 6 carbon atoms, such as trimethylsiloxy, triethylsiloxy, and tert-butyldimethylsiloxy. Exemplary of the oxoalkoxy group having 4 to 20 carbon atoms are 3-oxocyclohexyloxy and the groups shown below.

Where $R^1$, $R^2$ and $R^4$ stand for halogen atoms, fluorine, chlorine and bromine are exemplary.

The alkoxycarbonyl groups represented by $R^6$ are preferably those of 2 to 20 carbon atoms, especially 2 to 6 carbon atoms, such as methoxycarbonyl and tert-butoxycarbonyl. Exemplary of the halogen atom represented by $R^6$ are fluorine, chlorine and bromine.

The alkyl groups represented by $R^7$ may be straight, branched or cyclic, with tertiary alkyl groups being preferred. Where $R^7$ stands for a tertiary alkyl group, it is selected from a variety of such groups, and preferably groups of the following general formulae (5) and (6).

(5)

Herein, $R^{14}$ is a methyl, ethyl, isopropyl, cyclohexyl, cyclopentyl, vinyl, acetyl, phenyl, benzyl or cyano group, and b is 0 or an integer of 1 to 3.

(6)

Herein $R^{15}$ is a methyl, ethyl, isopropyl, cyclohexyl, cyclopentyl, vinyl, phenyl, benzyl or cyano group.

The cyclic alkyl groups of formula (5) are preferably 5- or 6-membered rings. Illustrative examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclo-hexyl.

Illustrative examples of the alkyl group of formula (6) include tert-butyl, 1-vinyldimethyl, 1-benzyldimethyl, 1-phenyldimethyl and 1-cyanodimethyl.

Other preferred examples of the alkyl group represented by $R^7$ include 2-methyladamantyl, 2-ethyladamantyl, 2-methylnorbornyl and 2-ethylnorbornyl.

It is preferred from the characteristics of resist composition standpoint that in formula (2), r be a positive number and p, q and s each be 0 or a positive number, and p, q, r and s satisfy the following equations: $0 < r/(p+q+r+s) \leq 0.5$, more preferably $0.05 < r/(p+q+r+s) \leq 0.40$, $0 \leq p/(p+q+r+s) \leq 0.8$, more preferably $0.3 \leq p/(p+q+r+s) \leq 0.8$, $0 \leq q/(p+q+r+s) \leq 0.35$, and $0 \leq s/(p+q+r+s) \leq 0.35$.

If q or s is equal to 0, that is, if the polymer of formula (2) does not contain the units associated therewith, detrimental effects may be exerted on the contrast of alkali dissolution rate and the resolution. If the proportion of p is too high, unexposed areas can have too high an alkali dissolution rate. If r is equal to 0, the resolution may be exacerbated and little improvement be made in dry etching resistance. By properly selecting the value of p, q, r and s within the above range, the size and shape of a pattern can be controlled as desired.

The inventive polymers should have a weight average molecular weight (Mw) of about 1,000 to 500,000 and preferably about 2,000 to 30,000. With too low Mw, polymers become less resistant to heat. Polymers with too high Mw have low alkali solubility and tend to induce a footing phenomenon after pattern formation.

It is recommended that the multi-component copolymer of formula (2) have a controlled molecular weight dispersity (Mw/Mn). If a copolymer has a wide dispersity, it contains more polymer fractions of low molecular weight and high molecular weight and thus forms a pattern after exposure with foreign matter left thereon or its shape disrupted. The influence of a molecular weight and its dispersity becomes greater as the pattern rule becomes finer. In order that a resist composition be advantageously used in patterning features to a finer size, the copolymer should preferably be a narrow disperse one having a molecular weight dispersity of 1.0 to 2.0, especially 1.0 to 1.5.

In one typical embodiment, the polymer can be synthesized by dissolving an acetoxystyrene monomer, a tertiary alkyl (meth)acrylate monomer and an indene monomer in an organic solvent, adding a radical initiator thereto, heat polymerizing the monomers, and subjecting the resulting polymer to alkaline hydrolysis in an organic solvent for deblocking the acetoxy group, thereby forming a ternary copolymer of hydroxystyrene, tertiary alkyl (meth)acrylate and indene. Examples of the organic solvent used in polymerization include toluene, benzene, tetrahydrofuran, diethyl ether, and dioxane. Representative of the polymerization initiator are 2,2'-azobisisobutyronitrile, 2,2'-azobis(2,4-dimethylvaleronitrile), dimethyl-2,2-azobis(2-methylpropionate), benzoyl peroxide and lauroyl peroxide. Polymerization may be effected by heating at about 50 to 80° C. The reaction time is usually about 2 to 100 hours, preferably about 5 to 20 hours. The base used in the alkaline hydrolysis is selected from aqueous ammonia and triethylamine, to name a few. The reaction temperature is about −20° C. to 100° C., preferably about 0 to 60° C. The reaction time is usually about 0.2 to 100 hours, preferably about 0.5 to 20 hours.

It is further possible that once the thus synthesized polymer is isolated, the acid labile group of formula (3) or (4) be introduced into the phenolic hydroxyl group portion thereof. For example, phenolic hydroxyl groups on the polymer are reacted with an alkenyl ether compound in the presence of an acid catalyst to produce a polymer in which phenolic hydroxyl groups are partially protected with alkoxyalkyl groups.

The reaction solvent used in this stage is preferably selected from aprotic polar solvents such as dimethylformamide, dimethylacetamide, tetrahydrofuran and ethyl acetate. Such solvents may be used alone or in admixture of any. Preferred acids used as the catalyst include hydrochloric acid, sulfuric acid, trifluoromethane-sulfonic acid, p-toluenesulfonic acid, methanesulfonic acid and pyridinium p-toluenesulfonate. The amount of the reactant used is preferably 0.1 to 10 mol % per mol of phenolic hydroxyl groups on the polymer. The reaction temperature is often in the range of about −20° C. to 100° C., and preferably about 0° C. to 60° C. The reaction time is from about 0.2 to 100 hours, and preferably about 0.5 to 20 hours.

In another embodiment, a halogenated alkyl ether compound can be used. It is reacted with the polymer in the presence of a base to produce a polymer in which phenolic hydroxyl groups are partially protected with alkoxyalkyl groups.

In this embodiment, the reaction solvent used is preferably selected from aprotic polar solvents such as acetonitrile, acetone, dimethylformamide, dimethylacetamide, tetrahydrofuran, and dimethylsulfoxide. Such solvents may be used alone or in admixture of any. Preferred bases include triethylamine, pyridine, diisopropylamine and potassium carbonate. The amount of the reactant used is preferably at least 10 mol % per mol of phenolic hydroxyl groups on the polymer. The reaction temperature is often in the range of about −50° C. to 100° C., and preferably about 0° C. to 60° C. The reaction time is from about 0.5 to 100 hours, and preferably about 1 to 20 hours.

In a further embodiment, the acid labile group of formula (4) can be introduced by reacting a dialkyl dicarbonate compound or alkoxycarbonylalkyl halide with the polymer in a solvent in the presence of a base. The reaction solvent used is preferably selected from aprotic polar solvents such as acetonitrile, acetone, dimethylformamide, dimethylacetamide, tetrahydrofuran, and dimethylsulfoxide. Such solvents may be used alone or in admixture of any. Preferred bases include triethylamine, pyridine, imidazole, diisopropylamine and potassium carbonate. The amount of the reactant used is preferably at least 10 mol % per mol of phenolic hydroxyl groups on the starting polymer. The reaction temperature is often in the range of about 0° C. to 100° C., and preferably about 0° C. to 60° C. The reaction time is from about 0.2 to 100 hours, and preferably about 1 to 10 hours.

Exemplary of the dialkyl dicarbonate compound are di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide and tert-butoxycarbonylethyl chloride.

It is noted that the synthesis is not limited to the aforementioned processes.

Resist Composition

The resist composition of the invention uses the above-mentioned polymer as a base resin and is positive working and especially useful as a chemically amplified positive resist composition. Specifically the resist composition comprises (A) an organic solvent, (B) the above-mentioned polymer as a base resin, and (C) a photoacid generator. If desired, the resist composition further includes (D) a dissolution inhibitor and/or (E) a basic compound.

In the chemically amplified, positive working resist composition of the invention, component (A) is an organic solvent. Illustrative, non-limiting, examples of the solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the solids in the chemically amplified positive resist composition. The concentration is not limited to this range as long as film formation by existing methods is possible.

The photoacid generator (C) is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenyl-sulfonium, bis(3-tert-butoxyphenyl)phenylsulfonium, tris(3-tert-butoxyphenyl)sulfonium, (3,4-di-tert-butoxy-phenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxy-carbonylmethyloxyphenyl)diphenylsulfonium, tris(4-tert-butoxycarbonylmethyloxyphenyl)sulfonium, (4-tert-butoxy-phenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethyl-sulfonium, 4-methoxyphenyldimethylsulfonium, trimethyl-sulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxy-benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyl-diazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutane-sulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl) methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl) propio-phenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzene-sulfonyl)-α-dimethylglyoxime, bis-O-(p-fluorobenzene-sulfonyl)-α-dimethylglyoxime, bis-O-(p-tert-butylbenzene-sulfonyl)-α-dimethylglyoxime, bis-O-(xylenesulfonyl)-α-dimethylglyoxime, and bis-O-(camphorsulfonyl)-α-dimethylglyoxime.

Of these photoacid generators, the sulfonium salts, bis-sulfonyldiazomethane compounds, and N-sulfonyloxyimide compounds are preferred.

While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutane-sulfonic acid anions, heptadecafluorooctanesulfonic acid anions, and camphorsulfonic acid anions.

In the chemically amplified positive resist composition, an appropriate amount of the photoacid generator (C) is 0 to about 20 parts, more preferably about 1 to 10 parts by weight per 100 parts by weight of the solids in the composition. The photoacid generators may be used alone or in admixture of two or more. The transmittance of the resist film can be controlled by using a photoacid generator having a low transmittance at the exposure wavelength and adjusting the amount of the photoacid generator added.

The dissolution inhibitor (D) is a compound having on the molecule at least two phenolic hydroxyl groups, in which an average of from 10 to 100 mol % of all the hydrogen atoms on the phenolic hydroxyl groups are replaced with acid labile groups. The compound has a weight average molecular weight within the range of 100 to 1,000, and preferably 150 to 800. The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. Less amounts of the dissolution inhibitor may fail to yield an improved resolution, whereas too much amounts would lead to slimming of the patterned film, and thus a decline in resolution.

Illustrative, non-limiting, examples of the dissolution inhibitor (D) which are useful herein include bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl) valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropyl-amine, n-butylamine, isobutylamine, sec-butylamine, tert-butylamine, pentylamine, tert-amylamine, cyclopentylamine, hexylamine, cyclohexylamine, heptylamine, octylamine, nonyl-amine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethyl-methylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethyl-amine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylene-diamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-amino-pyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanol-amine, triisopropanolamine, 2,2'-iminodiethanol, 2-amino-ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B1) may also be included alone or in admixture.

$$N(X)_n(Y)_{3-n} \qquad (B1)$$

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative examples of the compounds of formula (B1) include tris(2-methoxymethoxyethyl)amine, tris{2-(2-methoxyethoxy)ethyl}amine, tris{2-(2-methoxyethoxymethoxy)ethyl}-amine, tris{2-(1-methoxyethoxy)ethyl}amine, tris{2-(1-ethoxyethoxy)

ethyl}amine, tris{2-(1-ethoxypropoxy)ethyl}-amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxy-ethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyl-oxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxy-carbonylmethyloxy)ethyl]amine, tris(2-methoxycarbonyl-ethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)-ethylamine, N,N-bis(2-hydroxyethyl)-2-[(methoxycarbonyl)-methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxy-carbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compounds may be used alone or in admixture of two or more. The basic compound is preferably formulated in an amount of 0 to 2 parts, and especially 0.01 to 1 part by weight, per 100 parts by weight of the solids in the resist composition. The use of more than 2 parts of the basis compound would result in too low a sensitivity.

In the resist composition, a surfactant may be added for improving coating characteristics. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Florade FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the solids in the resist composition.

For the microfabrication of integrated circuits, any well-known lithography may be used to form a resist pattern from the chemical amplification, positive working, resist composition comprising (A) an organic solvent, (B) the polymer of formula (1) or (2), and (C) a photoacid generator, as illustrated above, according to the invention.

The composition is applied onto a substrate (on which an integrated circuit is to be formed, e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 µm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 $mJ/cm^2$, preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, soft x-rays, x-rays, excimer laser light, γ-rays and synchrotron radiation. With any of the above-described parameters outside the above-described range, the process may sometimes fail to produce the desired pattern.

EXAMPLE

Examples of the invention are given below by way of illustration and not by way of limitation. The abbreviation AIBN is azobisisobutyronitrile, Mw is a weight average molecular weight, Mn is a number average molecular weight, Mw/Mn is a molecular weight dispersity, NMR is nuclear magnetic resonance, GPC is gel permeation chromatography.

Synthesis Example 1

To a 2-liter flask were added 13.3 g of acetoxystyrene, 58.6 g of indene, 8.0 g of 1-ethylcyclopentyl methacrylate, and 80 g of toluene as a solvent. The reactor was cooled to −70° C. in a nitrogen atmosphere, whereupon vacuum deaeration and nitrogen blow were repeated three times. The reactor was warmed up to room temperature, 4.1 g of AIBN was added as a polymerization initiator, and the reactor was further heated to 60° C., at which reaction was effected for 15 hours. The reaction solution was concentrated to a 1/2 volume and poured into a mixture of 4.5 liters methanol and 0.5 liter water for precipitation. The resulting white solids were filtered and vacuum dried at 60° C., obtaining 57 g of a white polymer. The polymer was dissolved in a mixture of 0.5 liter methanol and 1.0 liter tetrahydrofuran again, to which 70 g of triethylamine and 15 g of water were added to effect deblocking reaction. The reaction solution was neutralized with acetic acid, concentrated, and dissolved in 0.5 liter of acetone. Following precipitation, filtration and drying in the same way as above, 45 g of a white polymer was obtained.

The polymer was analyzed by $^{13}$C-NMR, $^1$H-NMR and GPC, with the analytical results shown below.

Copolymer compositional ratio=hydroxystyrene:indene:1-ethylcyclopentyl methacrylate= 37.9:40.8:21.3

Mw=5,500

Mw/Mn=1.72

This polymer is designated Poly-A.

Synthesis Example 2

To a 2-liter flask were added 22.7 g of acetoxystyrene, 49.5 g of indene, 7.8 g of 1-ethylcyclopentyl methacrylate and 80 g of toluene as a solvent. The reactor was cooled to −70° C. in a nitrogen atmosphere, whereupon vacuum deaeration and nitrogen blow were repeated three times. The reactor was warmed up to room temperature, 4.0 g of AIBN was added as a polymerization initiator, and the reactor was further heated to 60° C., at which reaction was effected for 15 hours. The reaction solution was concentrated to a 1/2 volume and poured into a mixture of 4.5 liters methanol and 0.5 liter water for precipitation. The resulting white solids were filtered and vacuum dried at 60° C., obtaining 59 g of a white polymer. The polymer was dissolved in a mixture of 0.5 liter methanol and 1.0 liter tetrahydrofuran again, to which 70 g of triethylamine and 15 g of water were added to effect deblocking reaction. The reaction solution was neutralized with acetic acid, concentrated, and dissolved in 0.5 liter of acetone. Following precipitation, filtration and drying in the same way as above, 46 g of a white polymer was obtained.

The polymer was analyzed by $^{13}$C-NMR, $^1$H-NMR and GPC, with the analytical results shown below.

Copolymer compositional ratio=hydroxystyrene:indene:1-ethylcyclopentyl methacrylate= 53.8:28.8:17.4

Mw=6,500

Mw/Mn=1.75

This polymer is designated Poly-B.

Synthesis Example 3

To a 2-liter flask were added 36.8 g of acetoxystyrene, 32.9 g of indene, 10.3 g of 1-ethylcyclopentyl methacrylate and 70 g of toluene as a solvent. The reactor was cooled to −70° C. in a nitrogen atmosphere, whereupon vacuum deaeration and nitrogen blow were repeated three times. The reactor was warmed up to room temperature, 3.7 g of AIBN was added as a polymerization initiator, and the reactor was further heated to 60° C., at which reaction was effected for 15 hours. The reaction solution was concentrated to a 1/2 volume and poured into a mixture of 4.5 liters methanol and 0.5 liter water for precipitation. The resulting white solids were filtered and vacuum dried at 60° C., obtaining 65 g of a white polymer. The polymer was dissolved in a mixture of 0.5 liter methanol and 1.0 liter tetrahydrofuran again, to which 70 g of triethylamine and 15 g of water were added to effect deblocking reaction. The reaction solution was neutralized with acetic acid, concentrated, and dissolved in 0.5 liter of acetone. Following precipitation, filtration and drying in the same way as above, 52 g of a white polymer was obtained.

The polymer was analyzed by $^{13}$C-NMR, $^1$H-NMR and GPC, with the analytical results shown below.

Copolymer compositional ratio=hydroxystyrene:indene:1-ethylcyclopentyl methacrylate= 63.6:20.0:16.4

Mw=8,800

Mw/Mn=1.78

This polymer is designated Poly-C.

Synthesis Example 4

To a 2-liter flask were added 37.8 g of acetoxystyrene, 33.9 g of indene, 8.3 g of t-butyl methacrylate and 70 g of toluene as a solvent. The reactor was cooled to −70° C. in a nitrogen atmosphere, whereupon vacuum deaeration and nitrogen blow were repeated three times. The reactor was warmed up to room temperature, 3.8 g of AIBN was added as a polymerization initiator, and the reactor was further heated to 60° C., at which reaction was effected for 15 hours. The reaction solution was concentrated to a 1/2 volume and poured into a mixture of 4.5 liters methanol and 0.5 liter water for precipitation. The resulting white solids were filtered and vacuum dried at 60° C., obtaining 68 g of a white polymer. The polymer was dissolved in a mixture of 0.5 liter methanol and 1.0 liter tetrahydrofuran again, to which 70 g of triethylamine and 15 g of water were added to effect deblocking reaction. The reaction solution was neutralized with acetic acid, concentrated, and dissolved in 0.5 liter of acetone. Following precipitation, filtration and drying in the same way as above, 54 g of a white polymer was obtained.

The polymer was analyzed by $^{13}$C-NMR, $^1$H-NMR and GPC, with the analytical results shown below.

Copolymer compositional ratio=hydroxystyrene:indene:t-butyl methacrylate=63.3:19.8:16.9

Mw=8,500

Mw/Mn=1.73

This polymer is designated Poly-D.

Synthesis Example 5

To a 2-liter flask were added 30.8 g of acetoxystyrene, 117.9 g of indene and 20 g of toluene as a solvent. The reactor was cooled to −70° C. in a nitrogen atmosphere, whereupon vacuum deaeration and nitrogen blow were repeated three times. The reactor was warmed up to room temperature, 6.2 g of AIBN was added as a polymerization initiator, and the reactor was further heated to 60° C., at which reaction was effected for 15 hours. The reaction solution was concentrated to a 1/2 volume and poured into a mixture of 4.5 liters methanol and 0.5 liter water for precipitation. The resulting white solids were filtered and vacuum dried at 60° C., obtaining 77 g of a white polymer. The polymer was dissolved in a mixture of 0.5 liter methanol and 1.0 liter tetrahydrofuran again, to which 70 g of triethylamine and 15 g of water were added to effect deblocking reaction. The reaction solution was neutralized with acetic acid, concentrated, and dissolved in 0.5 liter of acetone. Following precipitation, filtration and drying in the same way as above, 52 g of a white polymer was obtained. The polymer was dissolved in 500 ml of tetrahydrofuran, to which 13.8 g of potassium carbonate and 10.2 g of t-butyl chloroacetate were added. Reaction was effected for 10 hours at room temperature. The reaction solution was neutralized with 5.0 g of acetic acid and poured into 4 liters of water for crystallization and precipitation. While solids were washed twice with water, filtered, and dried in vacuum at 40° C., obtaining 58 g of a white polymer.

The polymer was analyzed by $^{13}$C-NMR, $^1$H-NMR and GPC, with the analytical results shown below.

Copolymer compositional ratio=hydroxystyrene:indene:p-t-butoxycarbonylmethyloxystyrene=29.0:62.0:9.0

Mw=4,600

Mw/Mn=1.77

This polymer is designated Poly-E.

Synthesis Example 6

To a 2-liter flask were added 63 g of 5-hydroxyindene, 20.6 g of 1-ethylcyclopentyl methacrylate and 50 g of toluene as a solvent. The reactor was cooled to −70° C. in a nitrogen atmosphere, whereupon vacuum deaeration and nitrogen blow were repeated three times. The reactor was warmed up to room temperature, 4.2 g of AIBN was added as a polymerization initiator, and the reactor was further heated to 60° C., at which reaction was effected for 15 hours. The reaction solution was concentrated to a 1/2 volume and poured into a mixture of 4.5 liters methanol and 0.5 liter water for precipitation. The resulting white solids were filtered and vacuum dried at 60° C., obtaining 61 g of a white polymer.

The polymer was analyzed by $^{13}$C-NMR, $^1$H-NMR and GPC, with the analytical results shown below.

Copolymer compositional ratio=5-hydroxyindene:1-ethylcyclopentyl methacrylate=71.0:29.0

Mw=7,100

Mw/Mn=1.70

This polymer is designated Poly-F.

Comparative Synthesis Examples

Binary polymers were likewise synthesized. Their composition and analytical results are shown below.

Copolymer compositional ratio=hydroxystyrene:1-ethylcyclopentyl methacrylate =71:29

Mw=16,100

Mw/Mn=1.70

This polymer is designated Poly-G.

In a 2-liter flask, 40 g of polyhydroxystyrene (Mw=11,000, Mw/Mn=1.08) was dissolved in 400 ml of tetrahydrofuran. 1.4 g of methanesulfonic acid and 12.3 g of ethyl vinyl ether were added to the solution, and reaction was effected for one hour at room temperature and stopped by adding 2.5 g of 30% aqueous ammonia. The reaction solution was poured into 5 liters of aqueous acetic acid for crystallization and precipitation. White solids were washed with water twice, filtered and dried in vacuum at 40° C., obtaining 47 g of a white polymer.

The polymer was analyzed by $^{13}$C-NMR, $^1$H-NMR and GPC, with the analytical results shown below.

Copolymer compositional ratio=hydroxystyrene:p-ethoxyethoxystyrene=63.5:36.5

Mw=13,000

Mw/Mn=1.10

This polymer is designated Poly-H.

Examples 1–6 & Comparative Examples 1–2

Resist compositions were prepared according to the formulation shown in Tables 1 and 2. The polymers are Poly-A to H obtained in the above Synthesis Examples and Comparative Synthesis Examples, and the remaining components listed in Tables 1 and 2 have the following meaning.

PAG1: triphenylsulfonium 4-(4'-methylphenylsulfonyloxy)phenylsulfonate

PAG2: (4-tert-butylphenyl)diphenylsulfonium 4-(4'-methylphenylsulfonyloxy)phenylsulfonate PAG3: bis(cyclohexylsulfonyl)diazomethane PAG4: bis(2,4-dimethylphenylsulfonyl)diazomethane Dissolution inhibitor A: bis(4-(2'-tetrahydropyranyloxy)phenyl)methane Basic compound A: tris(2-methoxyethyl)amine Surfactant A: FC-430 (Sumitomo 3M Co., Ltd.)

Surfactant B: Surflon S-381 (Asahi Glass Co., Ltd.)

Solvent A: propylene glycol methyl ether acetate

Solvent B: ethyl lactate

TABLE 1

| Component | Example | | | |
|---|---|---|---|---|
| (pbw) | 1 | 2 | 3 | 4 |
| Poly-A | 80 | — | — | — |
| Poly-B | — | 80 | — | — |
| Poly-C | — | — | 80 | — |
| Poly-D | — | — | — | 80 |
| PAG1 | 2 | 2 | 2 | 2 |
| PAG2 | 1 | 1 | 1 | 1 |
| PAG3 | — | — | — | — |
| PAG4 | — | — | — | — |
| Dissolution inhibitor A | — | — | — | — |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

TABLE 2

| Component | Example | | Comparative Example | |
|---|---|---|---|---|
| (pbw) | 5 | 6 | 1 | 2 |
| Poly-E | 80 | — | — | — |
| Poly-F | — | 80 | — | — |
| Poly-G | — | — | 80 | — |
| Poly-H | — | — | — | 80 |
| PAG1 | 2 | 2 | 2 | 1 |
| PAG2 | — | 1 | 1 | 1 |
| PAG3 | 1 | — | — | — |
| PAG4 | — | — | — | 1 |
| Dissolution inhibitor A | — | — | — | — |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

The resist materials thus obtained were each filtered through a 0.2-μm Teflon filter, thereby giving resist solutions. These resist solutions were spin-coated onto silicon wafers, then baked on a hot plate at 100° C. for 90 seconds to give resist films having a thickness of 0.6 μm.

The resist films were exposed using an excimer laser stepper NSR2005EX (Nikon Corp., NA 0.5), then baked at 110° C. for 90 seconds (post-exposure baking: PEB), and developed with a solution of 2.38% tetramethylammonium hydroxide in water, thereby giving positive patterns (Examples 1–6 and Comparative Examples 1–2).

The resulting resist patterns were evaluated as described below.

Resist Pattern Evaluation

The exposure dose which provides a 1:1 resolution at the top and bottom of a 0.18-μm line-and-space pattern was the optimum exposure dose (sensitivity Eop). The minimum line width of a line-and-space pattern which was ascertained separate at this dose was the resolution of a test resist. The shape in cross section of the resolved resist pattern was examined under a scanning electron microscope.

The PED stability of a resist was evaluated by effecting post-exposure bake (PEB) after 24 hours of holding from exposure at the optimum dose and determining a variation in line width. The less the variation, the greater is the PED dimensional stability.

The results are shown in Table 3.

Other Evaluation

The dry etching resistance of the resist composition after development was examined by actually etching the resist film using a dry etching instrument TE-8500S (Tokyo Electron Co., Ltd.) under the following conditions.

Chamber pressure: 33.3 Pa
RF power: 800 W
Gas: (1) CHF$_3$ 20 ml/min
(2) CF$_4$ 20 ml/min
(3) Ar 400 ml/min
Etching time: 150 seconds At the end of etching, the pattern shape was examined by observing a resist section under a scanning electron microscope. A reduction of film thickness after etching was calculated, based on a reduction of film thickness after etching of 1.0 for Comparative Example 2. A smaller value indicates that the resist has better etching resistance.

TABLE 3

| | Sensitivity (mJ/cm$^2$) | Resolution (μm) | Profile | Dimensional stability on PED after 24 hours (nm) | Etching resistance (film thickness reduction) |
|---|---|---|---|---|---|
| Comparative Example 1 | 28 | 0.16 | rectangular | −9 | 0.98 |
| Comparative Example 2 | 26 | 0.17 | rectangular | −13 | 1.0 |
| Example 1 | 33 | 0.15 | rectangular | −5 | 0.85 |
| Example 2 | 31 | 0.15 | rectangular | −6 | 0.88 |
| Example 3 | 29 | 0.14 | rectangular | −8 | 0.91 |
| Example 4 | 35 | 0.17 | somewhat tapered | −5 | 0.92 |
| Example 5 | 34 | 0.16 | somewhat tapered | −7 | 0.77 |
| Example 6 | 28 | 0.15 | rectangular | −6 | 0.75 |

Figure 1:
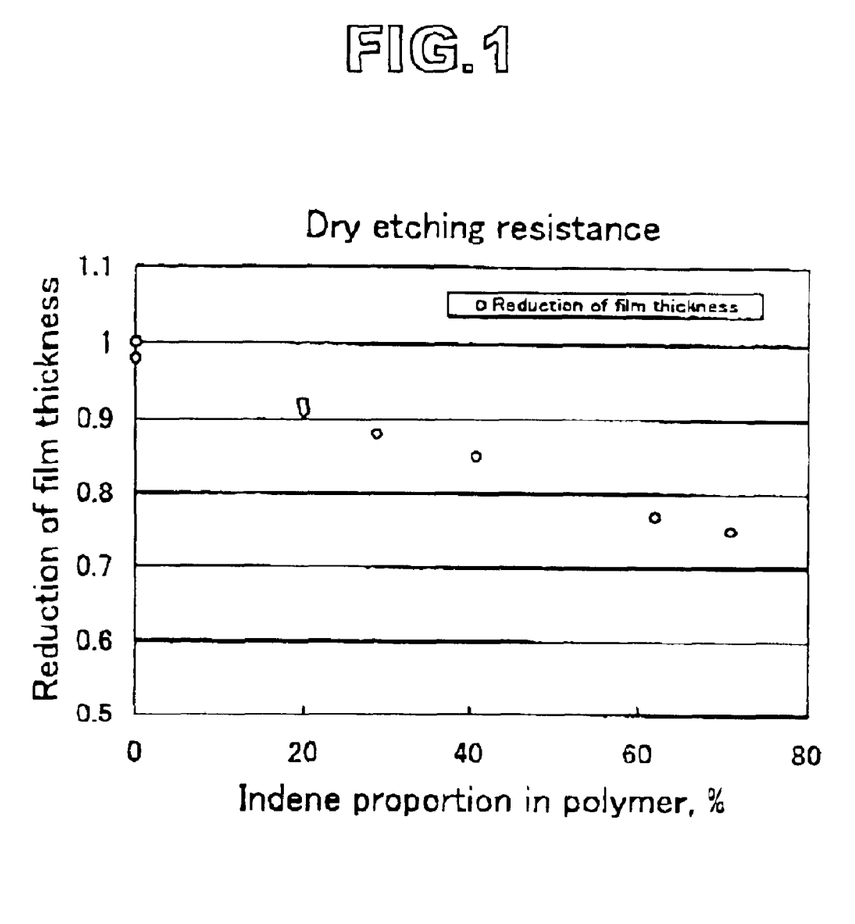
FIG. 1 is a graph showing dry etching resistance as a function of indene proportion in polymer.

FIG. 1 shows that dry etching resistance is more correlated to the proportion of indene in the polymer than to the structure of polymer and the resist composition.

There have been described resist compositions in which a polymer of formula (1) or (2) is blended as the base resin. The inventive compositions are suited as chemically amplified, positive resist compositions having advantages including a significantly enhanced contrast of alkali dissolution rate before and after exposure, high sensitivity, high resolution, and high etching resistance. The resist compositions are thus best suited as a micropatterning material for use in VLSI manufacture.

Japanese Patent Application No. 2000-334340 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

We claim:

1. A resist composition comprising a polymer comprising recurring units of the following general formula (1) and recurring units having acid labile groups which units increase alkali solubility as a result of the acid labile groups being decomposed under the action of acid, and having a weight average molecular weight of 1,000 to 500,000, (1)

wherein R$^1$ and R$^2$ each are a hydrogen atom, hydroxyl group, substitutable hydroxyalkyl group, straight or branched alkyl group, substitutable alkoxy group, or halogen atom, and n is 0 or a positive integer of 1 to 4.

2. A chemically amplified positive resist composition comprising
(A) an organic solvent,
(B) the polymer of claim 1 as a base resin, and
(C) a photoacid generator.

3. The resist composition of claim 2 further comprising (E) a basic compound.

4. A process for forming a resist pattern comprising the steps of:
applying the resist composition of claim 2 onto a substrate to form a coating,
heat treating the coating and then exposing it to high-energy radiation or electron beams through a photo mask, and
optionally heat treating the exposed coating and developing it with a developer.

5. A chemically amplified positive resist composition comprising
(A) an organic solvent,
(B) the polymer of claim 1 as a base resin,
(C) a photoacid generator, and
(D) a dissolution inhibitor.

6. The resist composition of claim 5 further comprising (E) a basic compound.

7. A process for forming a resist pattern comprising the steps of:
applying the resist composition of claim 5 onto a substrate to form a coating,
heat treating the coating and then exposing it to high-energy radiation or electron beams through a photo mask, and
optionally heat treating the exposed coating and developing it with a developer.

8. A composition according to claim 1, wherein the hydroxyalkyl group is a hydroxymethyl, trifluoromethylated hydroxymethyl, or ditrifluoromethylated hydroxymethyl.

9. A composition according to claim 1, wherein the straight or branched alkyl group is a methyl, an ethyl, a propyl, an isopropyl, an n-butyl, an iso-butyl, or a tert-butyl.

10. A composition according to claim 1, wherein the alkoxy group is a methoxy, an ethoxy or an isopropoxy.

11. A resist composition comprising a polymer comprising recurring units of the following general formula (2) and having a weight average molecular weight of 1,000–500,000, (2)

wherein $R^1$, $R^2$ and $R^4$ each are a hydrogen atom, hydroxyl group, substitutable hydroxyalkyl group, straight or branched alkyl group, substitutable alkoxy group, or halogen atom, $R^3$ and $R^5$ each are hydrogen or methyl, $R^6$ is a hydrogen atom, methyl group, alkoxycarbonyl group, cyano or halogen atom, $R^7$ is an alkyl group of 1 to 20 carbon atoms, n is 0 or a positive integer of 1 to 4, m is 0 or a positive integer of 1 to 5, p, q and s each are 0 or a positive number, and r is a positive number, and a photoacid generator.

12. The resist composition of claim 11 wherein in formula (2), at least one of $R^1$ and $R^4$ is selected from the class consisting of groups of the following formulae (3) and (4), straight, branched or cyclic tertiary alkoxy groups of 4 to 20 carbon atoms, trialkylsiloxy groups whose alkyl portions each have 1 to 6 carbon atoms, and oxoalkoxy groups of 4 to 20 carbon atoms, (3)

(4)

wherein $R^8$, $R^9$, $R^{11}$ and $R^{12}$ are independently selected from hydrogen and straight or branched alkyl groups of 1 to 8 carbon atoms, $R^{10}$ is a monovalent hydrocarbon group of 1 to 18 carbon atoms which may be separated by an oxygen atom, or a pair of $R^8$ and $R^9$, $R^8$ and $R^{10}$, or $R^9$ and $R^{10}$ may form a ring and each of $R^8$, $R^9$ and $R^{10}$ is a straight or branched alkylene group of 1 to 18 carbon atoms when they form a ring, $R^{13}$ is a straight, branched or cyclic alkyl group of 4 to 40 carbon atoms, and "a" is 0 or a positive integer of 1 to 5.

13. A composition according to claim 11, wherein the hydroxyalkyl group is a hydroxymethyl, trifluoromethylated hydroxymethyl, or ditrifluoromethylated hydroxymethyl.

14. A composition according to claim 11, wherein the straight or branched alkyl group is a methyl, an ethyl, a propyl, an isopropyl, an n-butyl, an iso-butyl, or a tert-butyl.

15. A composition according to claim 11, wherein the alkoxy group is a methoxy, an ethoxy or an isopropoxy.

16. A composition according to claim 11, wherein $R^6$ is a $C_2$–$C_6$ alkoxycarbonyl group.

17. A resist composition comprising a polymer comprising recurring units of the following general formula (2) and having a weight average molecular weight of 1,000–500,000, (2)

wherein $R^1$, $R^2$, and $R^4$ each are a hydrogen atom, hydroxyl group, substitutable hydroxyalkyl group, straight or branched alkyl group, substitutable alkoxy group, or halogen atom, $R^3$ and $R^5$ each are hydrogen or methyl, $R^6$ is a hydrogen atom, methyl group, alkoxycarbonyl group, cyano or halogen atom, $R^7$ is an alkyl group of 1–20 carbon atoms, n is 0 or a positive integer of 1–4, m is 0 or a positive integer of 1–5, p, q and s each are 0 or a positive number, and r is a positive number, wherein at least one of $R^1$ and $R^4$ is of the formula (3) or (4), a straight, branched or cyclic tertiary alkoxy group of 4–20 carbon atoms, a trialkylsiloxy group whose alkyl portions each have 1–6 carbon atoms or an oxoalkoxy group of 4–20 carbon atoms, wherein $R^8$, $R^9$, $R^{11}$ and $R^{12}$ are independently hydrogen or a straight or branched alkyl group of 1–8 carbon atoms, $R^{10}$ is a monovalent hydrocarbon group of 1–18 carbon atoms which may be separated by an oxygen atom, or a pair of $R^8$ and $R^9$, $R^8$ and $R^{10}$, or $R^9$ and $R^{10}$ may form a ring and each of $R^8$, $R^9$ and $R^{10}$ is a straight or branched alkylene group of 1–18 carbon atoms when they form a ring, $R^{13}$ is a straight, branched or cyclic alkyl group of 4–40 carbon atoms, and "a" is 0 or a positive integer of 1–5.

18. A resist composition comprising a polymer comprising recurring units of the following general formula (2) and having a weight average molecular weight of 1,000–500,000, wherein $R^1$, $R^2$ and $R^4$ each are a hydrogen atom, hydroxyl group, substitutable hydroxyalkyl group, straight or branched alkyl group, substitutable alkoxy group, or halogen atom, $R^3$ and $R^5$ each are hydrogen or methyl, $R^6$ is a hydrogen atom, methyl group, alkoxycarbonyl group, cyano or halogen atom, $R^7$ is an alkyl group of 1–20 carbon atoms, n is 0 or a positive integer of 1–4, m is 0 or a positive integer of 1–5, p, q and s each are 0 or a positive number, and r is a positive number, and a photoacid generator and a basic compound.

* * * * *